United States Patent [19]

Breedlove

[11] 4,366,342
[45] Dec. 28, 1982

[54] CONDUCTIVELY COATED EMBOSSED ARTICLES

[75] Inventor: James G. Breedlove, Burnsville, Minn.

[73] Assignee: Minnesota Mining and Manufacturing Company, Saint Paul, Minn.

[21] Appl. No.: 191,329

[22] Filed: Sep. 26, 1980

Related U.S. Application Data

[63] Continuation of Ser. No. 917,577, Jun. 21, 1978, abandoned, which is a continuation-in-part of Ser. No. 755,975, Dec. 30, 1976, abandoned.

[51] Int. Cl.³ .............................................. H05K 5/00
[52] U.S. Cl. .................................. 174/52 FP; 357/80; 361/403
[58] Field of Search .................... 174/52 FP, 52 S; 361/399, 403, 406; 357/80, 74

[56] References Cited

U.S. PATENT DOCUMENTS

| | | | |
|---|---|---|---|
| 3,271,507 | 9/1966 | Elliott | 174/52 FP |
| 3,302,067 | 1/1967 | Jackson et al. | 361/414 |
| 3,404,214 | 10/1968 | Elliott | 174/52 FP |
| 3,436,605 | 4/1969 | Landron, Jr. | 361/403 |
| 3,483,308 | 12/1969 | Wakely | 174/52 FP |
| 3,520,054 | 7/1970 | Pensack et al. | 174/52 FP X |
| 3,680,206 | 8/1972 | Roberts | 357/80 |
| 4,038,488 | 7/1977 | Lin | 174/52 FP |
| 4,054,938 | 10/1977 | Morris, Sr. | 361/401 |

FOREIGN PATENT DOCUMENTS 1446305  6/1966  France ............................. 361/401

*Primary Examiner*—A. T. Grimley
*Assistant Examiner*—D. A. Tone
*Attorney, Agent, or Firm*—Cruzan Alexander; Donald M. Sell; Edward T. Okubo

[57] ABSTRACT

Substrates of ceramic or plastic are formed with embossed patterns in bas-relief which are coated by transfer processes to provide conductors. The articles are especially useful for high speed automatic processing and further have improved electrical properties particularly for high frequency applications.

19 Claims, 50 Drawing Figures

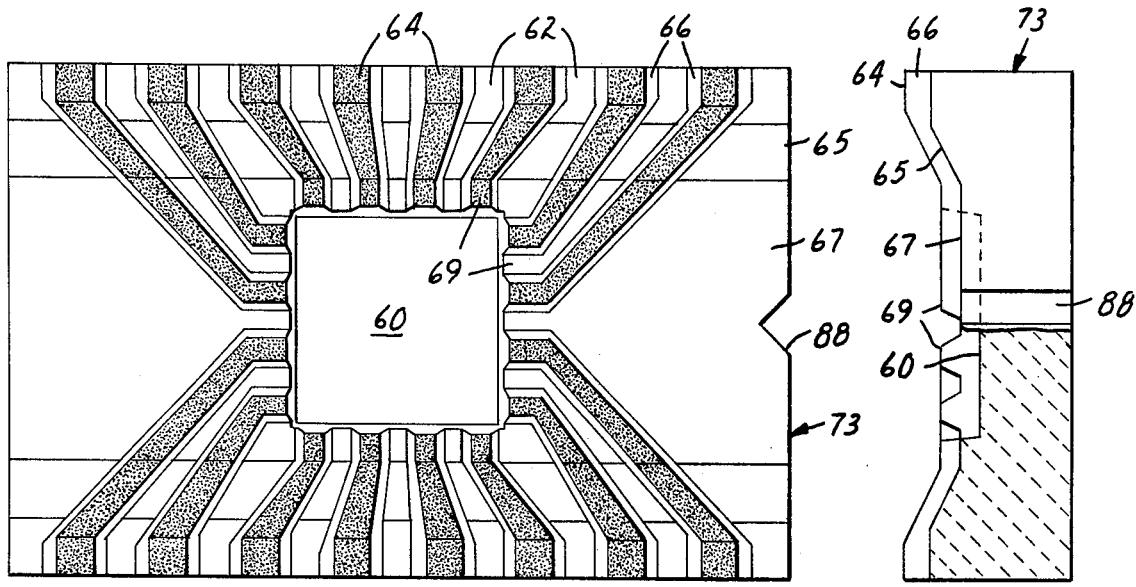
FIG. 6
FIG. 8
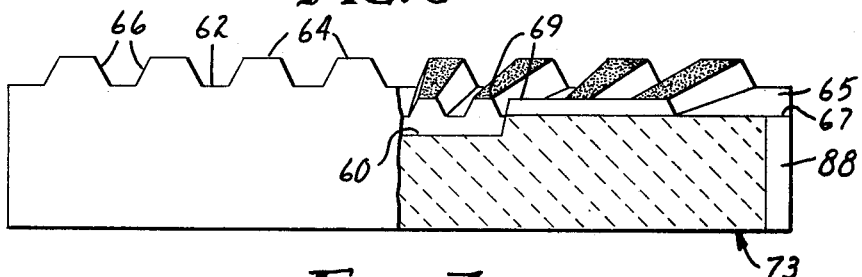
FIG. 7
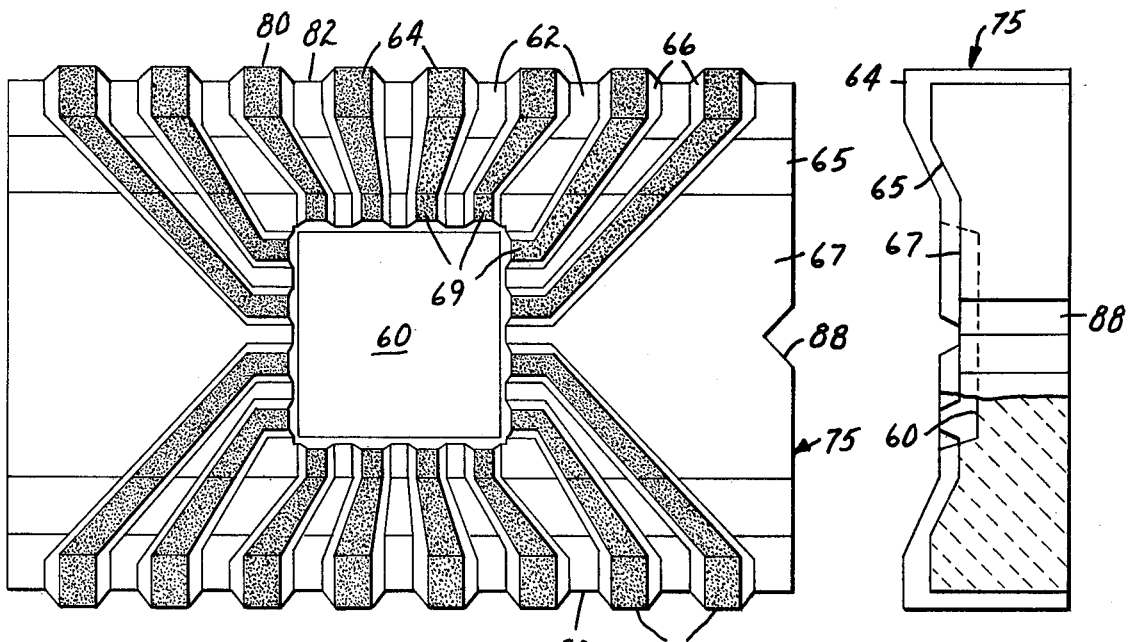
FIG. 9
FIG. 10

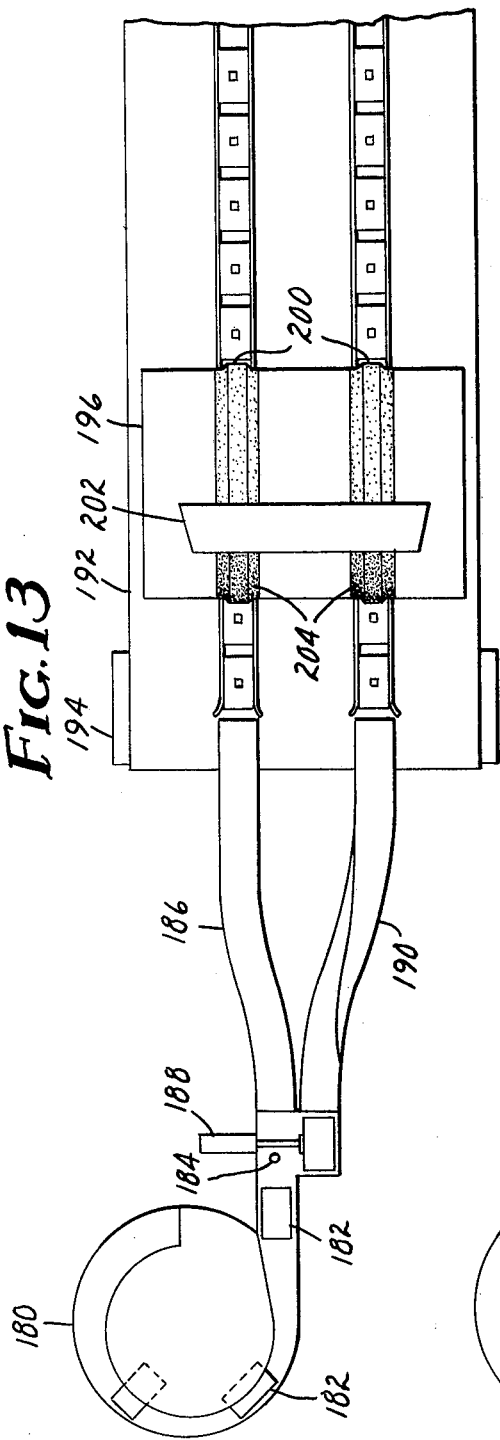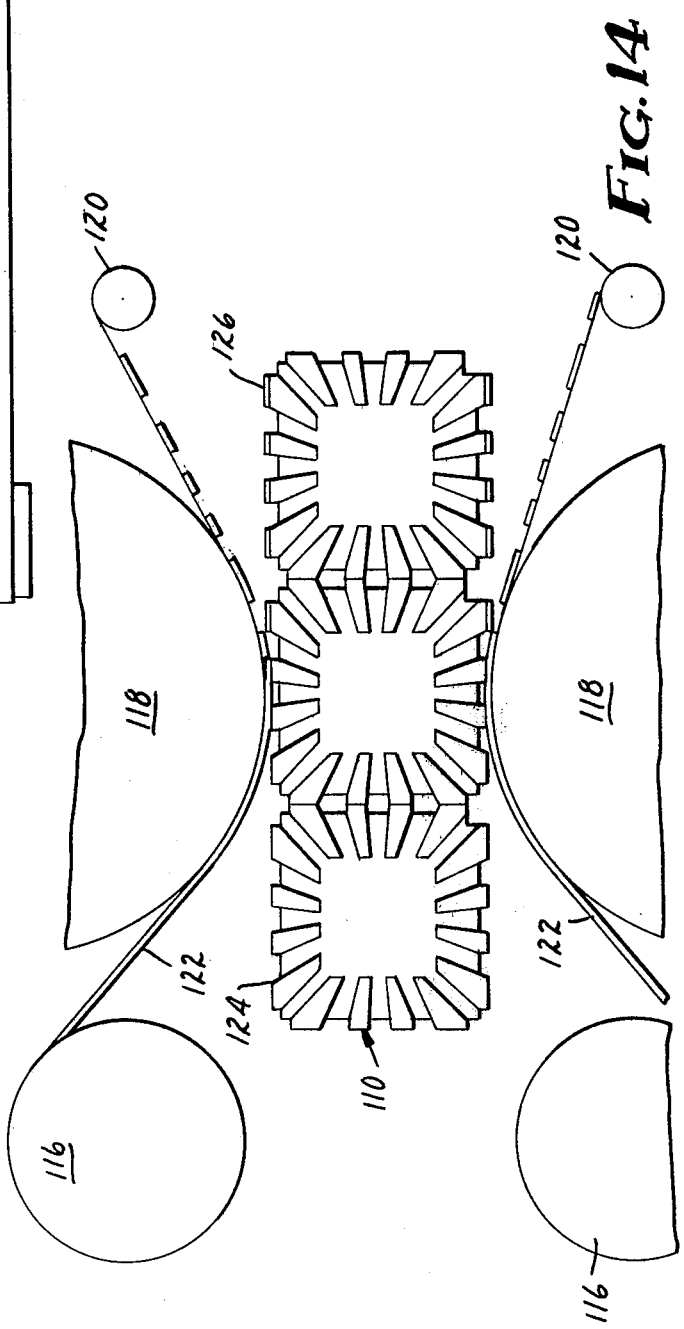

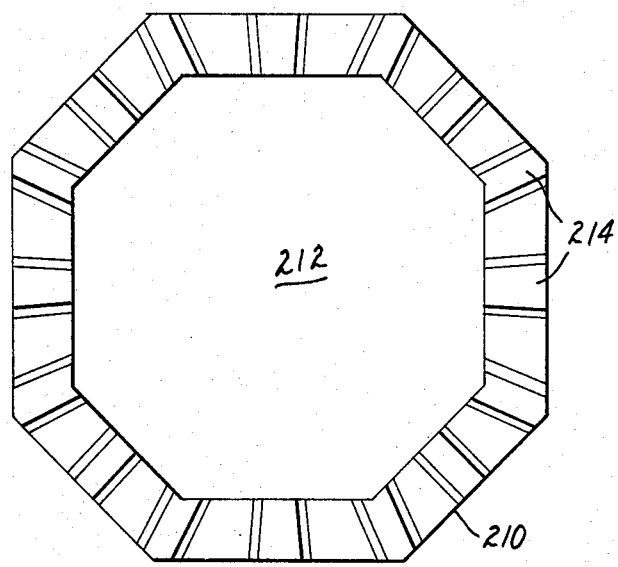
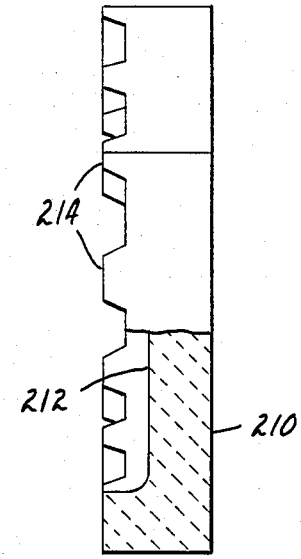
FIG.15  FIG.16
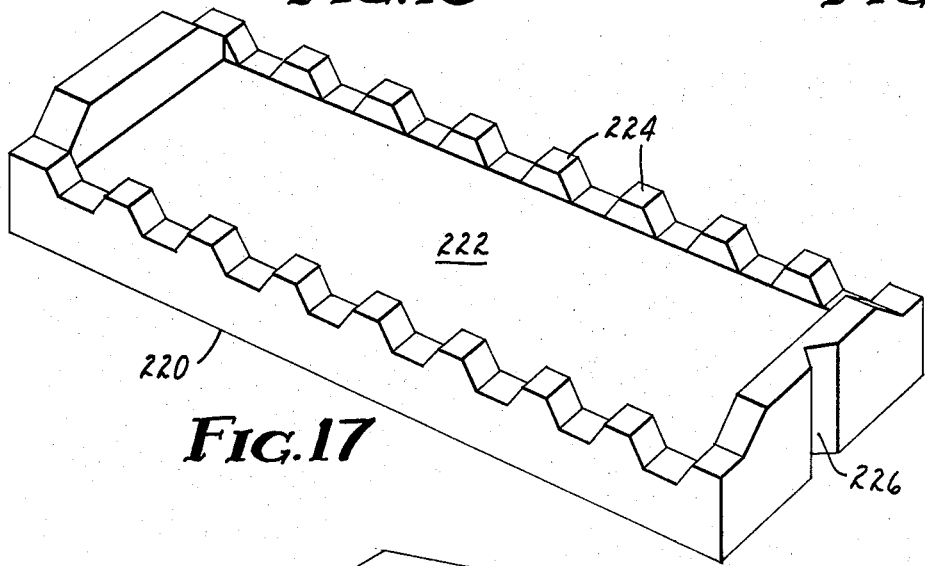
FIG.17
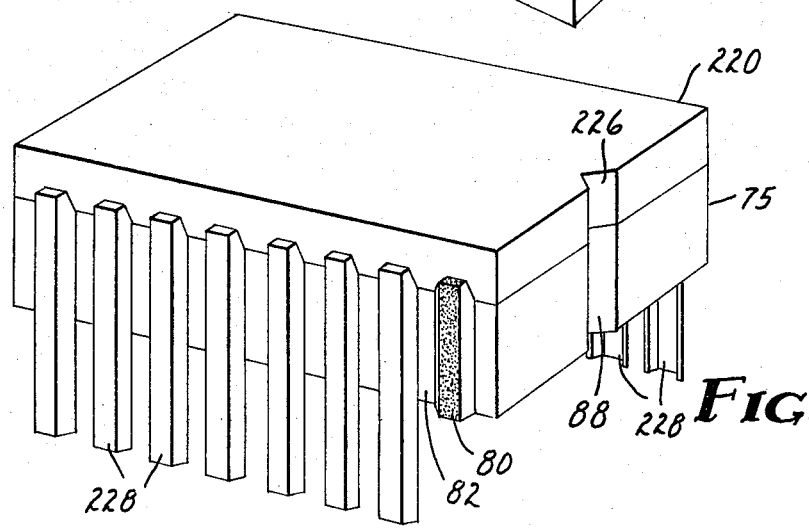
FIG.18

CONDUCTIVELY COATED EMBOSSED ARTICLES

This application is a continuation of copending application Ser. No. 917,577, filed June 21, 1978, now abandoned, which application was a continuation-in-part of copending application Ser. No. 755,975, filed Dec. 30, 1976, now abandoned.

This invention relates to articles with conductive coatings for electronic applications and to processes for producing the articles. In particular this invention relates to metallized plastic or ceramic articles having raised bas-relief or embossed coated surfaces in connective configurations. The invention thus relates to the fabrication of ceramic or plastic articles such that areas to be metallized are formed in raised bas-relief on one, two or more surfaces of a substrate and are integral with the substrate. Conductive material is applied by convenient transfer processes to the raised bas-relief surfaces of the substrate and sintered or hardened to form a pattern of electrical conductors on the substrate. Package covers with mating patterns of recessed bas-relief to fit the contours of the substrate are also provided. The articles of the invention are particularly suitable for high-volume, automated electronic circuit assembly, e.g., by process known as tape-carrier packaging.

Metallization of ceramic pieces for electronic uses such as packages, chip carriers, substrates and the like has been accomplished quite conventionally by silk-screening processes in which a metallic pigment in selected vehicle is first laid down on the surface of a green or fired ceramic. The vehicle is then volatilized and the metallic pigment, such as molybdenum-manganese, platinum, palladium, is sintered to give adherent conductive patterns. This procedure is illustrated in Stetson, U.S. Pat. No. 3,189,978 for multilayer devices in which interconnections between layers are by via holes or metallized edge notches. A device for a chip carrier is described by Landron U.S. Pat. No. 3,436,605 in which a chip is mounted among three legs and suitably connected to metallized coatings thereon. Each leg has a rounded end which is metallized together with other portions of the leg and which end is bonded to a suitable mother board. Pedestals with sprayed metal coatings connected by leads to a semiconductor device on the upper side of the modular package are described by Wakely, U.S. Pat. No. 3,483,308.

Metallizing processes of the prior art present many problems. Screens become clogged and must be cleaned regularly or incomplete patterns result. There is also a problem of registration of the pattern of the screen or mask with the ceramic part-resulting in misplaced patterns which occur on a random basis according to the placement of each ceramic part with relation to the pattern of screen. Warpage of the ceramic parts results in distorted and incomplete patterns. Stretching and distortion of the screen also results in distorted patterns.

The screening process is not well-suited to high production rates. The time-cycle period is often several seconds, and attempts to process a large number of parts per cycle invariably result in increasing the problems of pattern placement and distortion. Screening of a pattern in an array on one support followed by separation of the support into individual units reduces screening costs but introduces additional problems. For example laser-scribing has been used to separate the individual units from an array; but this adds cost and the ceramic parts have rough edges and variability of size so they are not free-feeding and therefore are ill-suited for high-speed automated handling.

It is a principal aim and object of this invention to provide ceramic and plastic articles having conductive coatings by processes which avoid the high cost and the limitations of the screening process. Other objects will become evident from the disclosure herewith.

In accordance with these and other objects of the invention electrically conductive patterned ceramic and plastic substrates are readily produced by first forming green ceramic pieces or molded plastic pieces having embossed patterns for circuitry on at least one surface. Subsequently, a conductive coating is transferred to the elevated surfaces and suitably cured, e.g., by firing to sinter a metallizing ink and ceramic substrate or low-temperature curing of conductive epoxy resin on a plastic substrate. Generally bas-relief or embossed patterns are provided on one or both major surfaces and often also on two or more edges of a substrate. Such substrates are illustrated herewith without intending to be limited to the illustrative supports as those skilled in the art will readily perceive of numerous other variations within the scope of the invention which is a monolithic body of ceramic or plastic having thereon and integral therewith embossments with planar outer surfaces receptive to transfer of electrically conductive coatings, said embossments together constituting a predetermined pattern for electrical interconnections. The invention further embraces the articles having electrical conductive coatings on the embossments.

The power-compaction process commonly called dry pressing is found to be the most convenient method for forming ceramic substrates. Plastic parts can be made by any of the conventional processes for molding plastics. After forming, the ceramic parts are usually fired to a high temperature to sinter the ceramic to an impervious condition either before or after application of metallization. Any insulative moldable plastic can be used.

Several alternative sequences of metallization are contemplated. It will be recognized that metallization is illustrative of all conductive coatings. The choice of method for metallization itself will depend on various factors. Other coatings will require different treatment which will be known in the art. In some cases it is advantageous to metallize the unfired substrates with refractory metal suitable for sintering with the ceramic. In other cases the ceramic substrates are fired to intermediate temperatures to burn out the temporary binders or other additives and to achieve sufficient strength for metallizing. Firing to a high temperature then follows the final metallization. Multiple firings may also be employed when different metallizing materials are employed. In this case the more refractory metallizing is applied and fired first, followed by application and firing of one or more less refractory metallizations. The fired metallization can be metal-plated, if desired, by conventional processes.

Metallizing can be conveniently applied to the surfaces of the substrate by transfer processes. The metallizing material is usually applied to the surfaces successively, but may be applied simultaneously. Opposite surfaces may for example be metallized simultaneously by passing the part between two metallizing transfer tapes which transfer the metallizing material from the tape to the parts. In another transfer process, wet metallizing is applied, for example, by transfer from a rotating inked roller, and preferably to only one surface followed by drying or firing before application to another surface. This avoids possible problems of smearing and loss of the wet metallizing. Conductive patterns can be continued from the obverse surface (where the semiconductor die or chip is mounted) to terminals on the reverse surface by metallized bas-relief patterns around the edges.

The green ceramic pieces are pressed by conventional methods from any desired ceramic materials such as alumina or beryllia suitably containing milled in small amounts of suitable lubricants and temporary binders as are well known in the ceramic arts.

Dies for compressing ceramic pieces are prepared by the usual processes with close adherence to tolerances. Although the ceramic pieces may be symmetrical about a vertical axis it is preferred that the piece be indexed, for example, by omission of one square corner. This is of assistance in mechanically operating on the pieces and provides orientation after mounting chips or dice.

Because the small chip carriers, cross connectors and other parts or substrates formed by the process of the invention are to be handled mechanically they are designed with great care. Thus, it is desirable to avoid locking in side to side, or end to end, or end to side positions. For this reason spaces between metallized lugs on the edges are less than the widths of the lugs. This prevents interlocking of two pieces in various manufacturing processes. For the same reason the bas-relief patterns on upper and lower surfaces do not mate either with one another, top and bottom, or with their own kind, i.e., top to top or bottom to bottom. Separate covers can be made which do mate to tops or bottoms so that enclosed chips can be encapsulated to form a module or package. When made according to this invention those covers are self-aligning. This advantage was not known heretofore. These covers provide protection to the very fine leads from semiconductor die or chip to carrier. It is also contemplated to make pieces deliberately designed to be stacked and interconnected so that bottom of one piece will mate with and connect electrically to the top of the next lower piece.

Chip carriers and other articles of the invention have at least one major surface with at least two levels, viz., a base plane and the bas-relief or embossed plane. The vertical distance between the planes will vary depending on the size of the piece and distances between embossments. A convenient amount is roughly 10–35% of the thickness of the piece or about the minimum width of an embossment. In any event it should be at least twice the camber or warpage occurring in the piece. For pieces having a camber of 0.3%, i.e. 0.03 mm per cm., the distance between planes will be at least 0.075 to 0.1 mm and may be up to 0.3 mm. Such a piece may be roughly 1 mm thick and 1 cm square.

Other levels may be provided in the piece as required. A recess or cavity below the base plane can be incorporated to facilitate accomodating a semiconductor die or chip and the leads thereto. Inclined surfaces may be used in some instances.

Conductive coatings are always applied to articles of the invention on the outer-most, bas-relief plane or surface with base plane or surface normally not metallized as contrasted to prior art devices. The latter are commonly metallized on the base surface and, where multilayers are employed, often are metallized on each layer. Articles of the invention are connected from top to bottom by overlap connections running along outer bas-relief or embossed patterns rather than by via holes or filled grooves.

The surface rising from the base plane to intersect the bas-relief plane is termed the inclined plane. The angle which the inclined plane makes with the base plane is found to be important in the production of substrates of the invention and for ceramics and is usually in the range of about 45° to 75°. The reason for inclining these at an angle is to facilitate removal of the parts from the die. To some extent, also, these inclined planes tend to strengthen the embossments of the bas-relief plane and avoid tendency of ceramic parts of stick in dies as can be the case if the angle approaches 90°. For plastic substrates inclined planes may be more nearly at right angles to the base plane, from 45° to 90°.

Having now described the invention in broad general terms it is more particularly illustrated by the drawings wherein

FIGS. 3, 3A, 3B, 3C, and 3D show the upper or top chip carrying surfaces of ceramic chip carriers of the invention.

FIGS. 4, 4A, 4B, and 4C show partial cross-section at 4—4, 4A—4A, 4B—4B, and 4C—4C, respectively, of FIGS. 3, 3A, 3B, and 3C; FIGS. 4D, 4E, and 4F show an enlarged portion of FIG. 3D.

Figure 3:
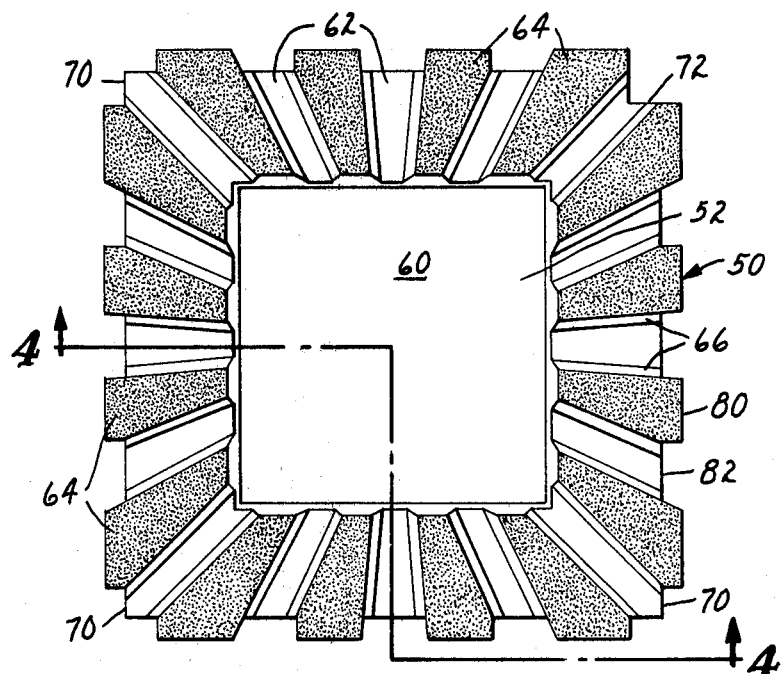
Figure 5:
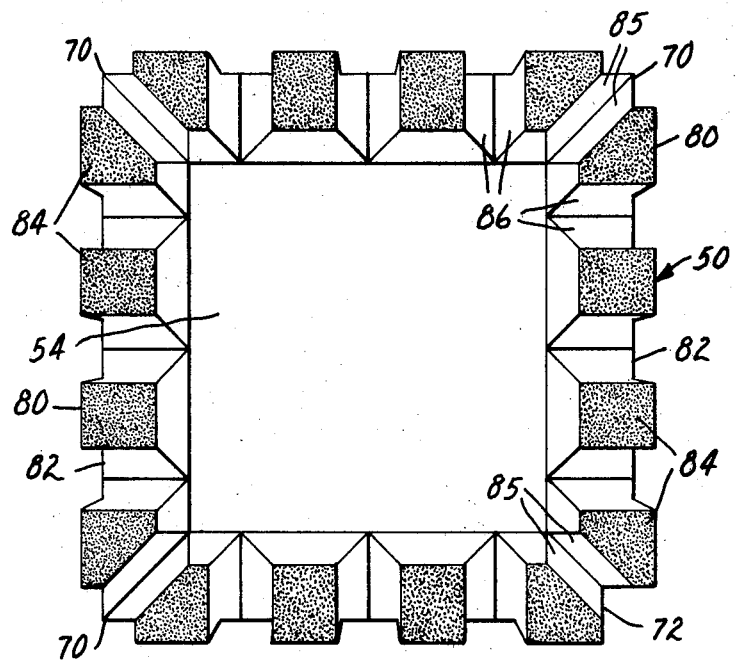
Figure 5C:
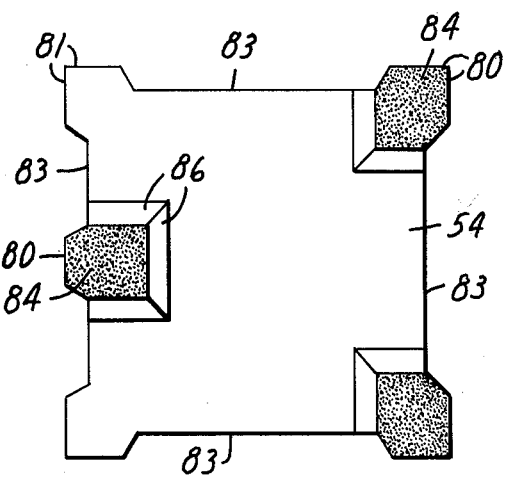
Figure 5D:
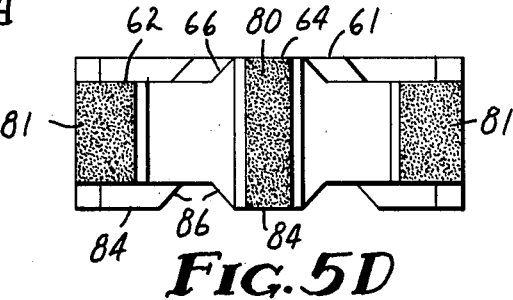

FIG. 5 shows the bottom or lower surface of the chip carrier of FIG. 3. FIG. 5C shows the lower surface of the carrier of FIG. 3C and FIG. 5D shows the left side.

FIG. 6 shows a top view of a metallized ceramic substrate having a dual-in-line pattern of conductors in bas-relief which provides a central cavity for a microcircuit chip, and which may be mounted to a larger circuit board in inverted position without leads and FIGS. 7 and 8 show longitudinal side and end views, each in partial section, respectively of the substrate of FIG. 6.

FIG. 9 shows a metallized ceramic substrate having a top surface similar to the substrate of FIG. 6, and providing conductors in bas-relief along two opposite edges suitable for attachment of lead wires and is shown in end view in FIG. 10 in partial section.

Figure 4:
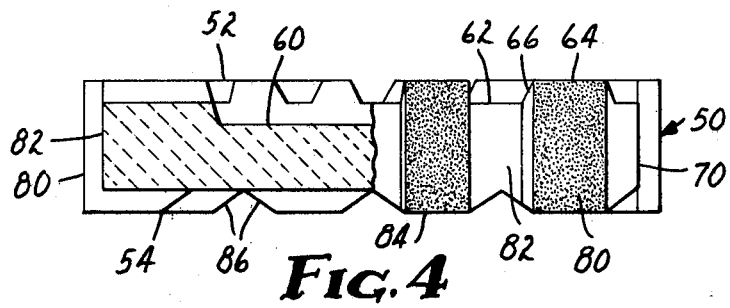
Figure 11:
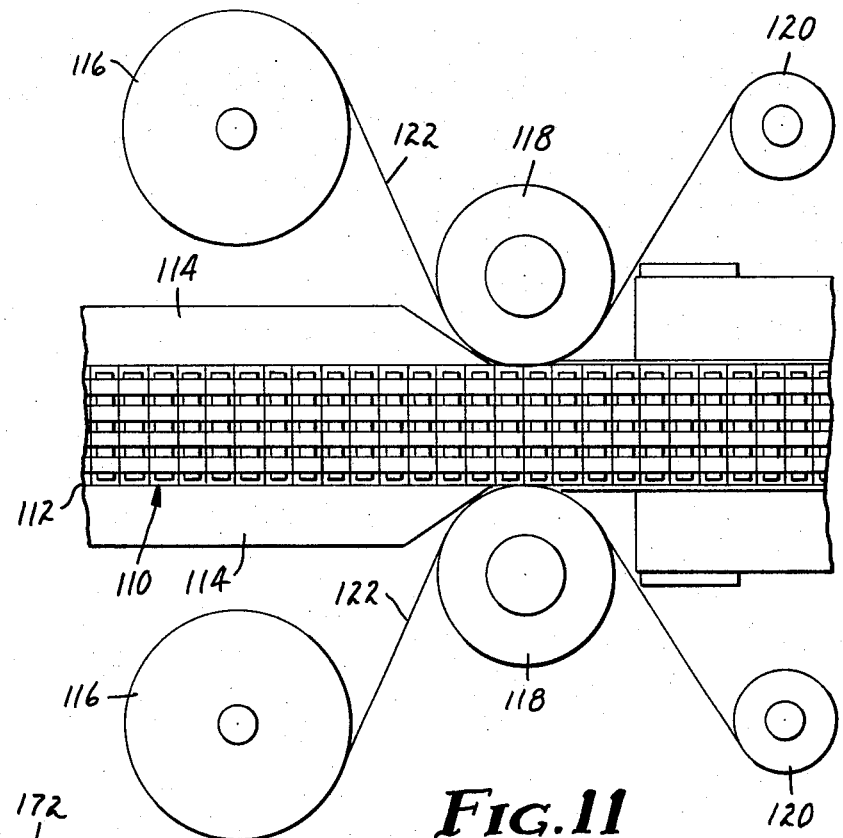

FIG. 11 shows a method for metallizing the edges of ceramic chip carriers, e.g. as shown in FIGS. 3, 4 and 5.

Figure 12:
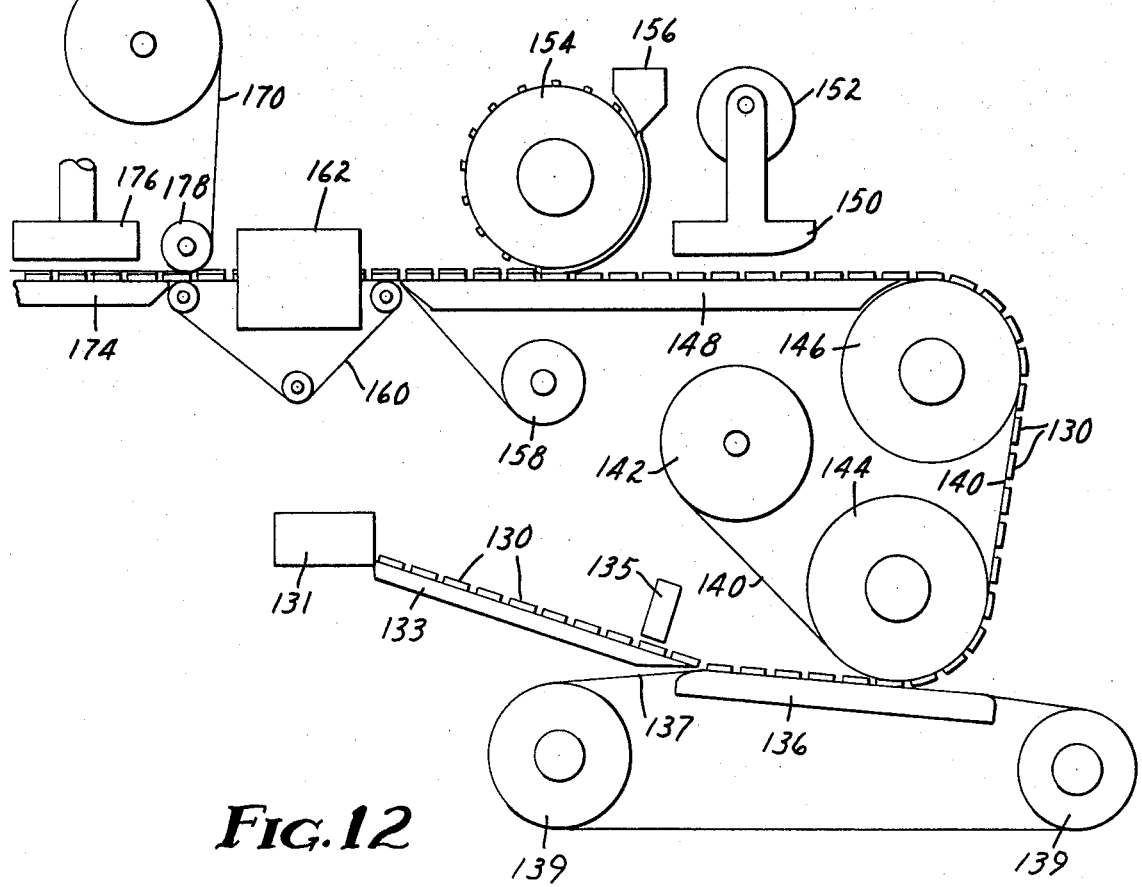

FIG. 12 shows a process for metallizing major surfaces of substrates by roller transfer of wet metallizing material.

FIG. 13 shows a method of metallizing the substrate of FIG. 6 by transfer of wet metallizing paste from a roller having a mating configuration.

FIG. 14 shows a process of metallizing the edges of chip carriers, e.g. of FIGS. 3, 4 and 5, by tape transfer from a carrier film.

FIG. 15 shows a plane view of a package cover for the chip carrier of FIGS. 3, 4 and 5 and FIG. 16 shows an end view in partial section.

FIG. 17 shows a package cover for the substrate of FIG. 9.

FIG. 18 shows a ceramic package consisting of the substrate of FIG. 9 with bonded lead wires and the package cover of FIG. 17 and enclosing a chip device.

Figure 19:
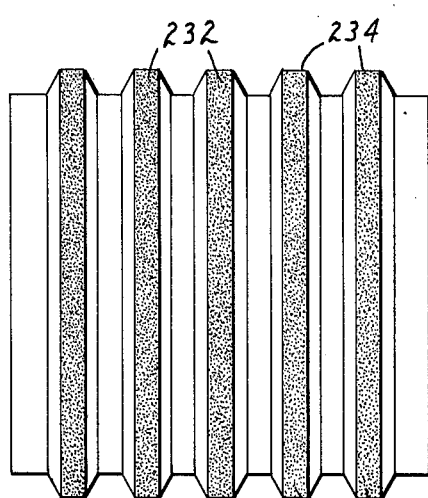
Figure 21:
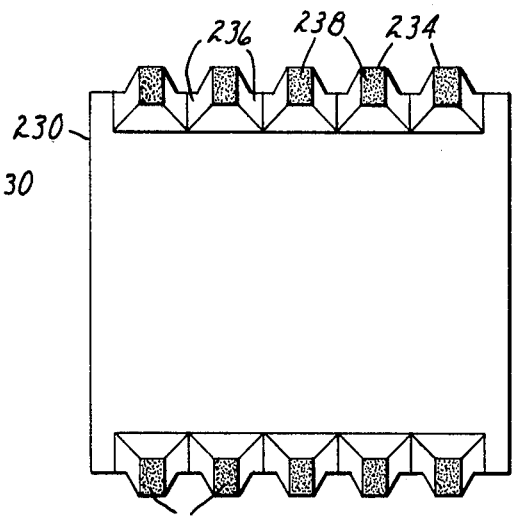
Figure 20:
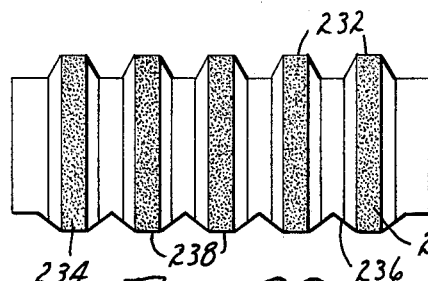
Figure 22:
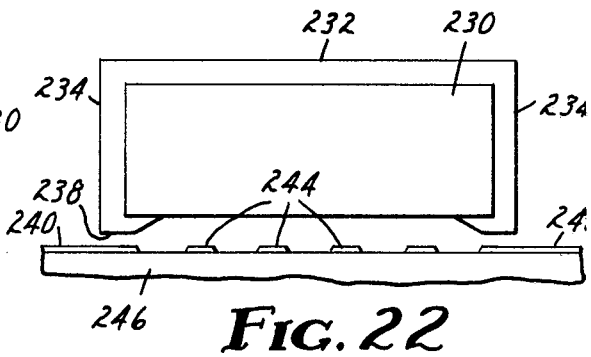

FIGS. 19, 20 and 21 show a ceramic cross-connector according to the invention in plane, end and underside views respectively and FIG. 22 shows in side view diagrammatically how the cross-connector of FIGS. 19, 20 and 21 is used.

Figure 23:
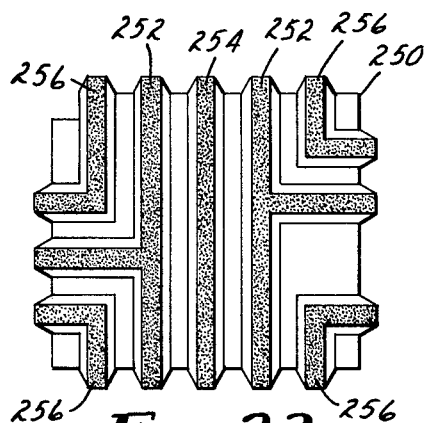
Figure 24:
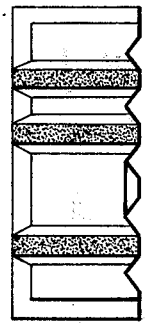
Figure 25:
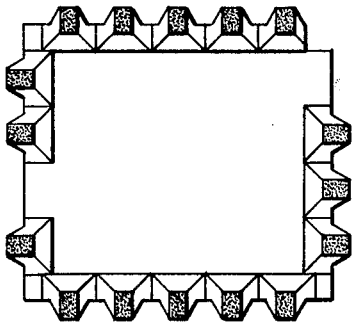
Figure 26:
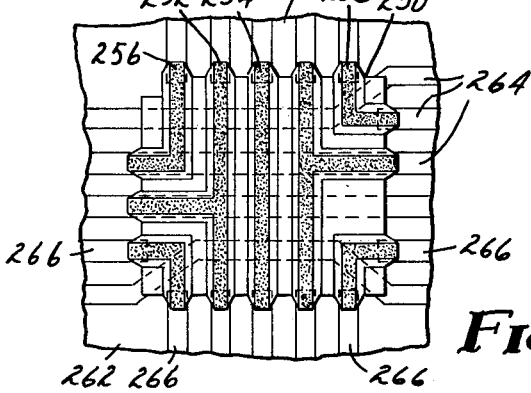

FIGS. 23, 24 and 25 show a ceramic interconnector of the invention in plane, side and underside views, respectively and FIG. 26 shows a diagrammatic plane view of an interconnector of FIG. 23 applied to a portion of a circuit board.

Figure 27:
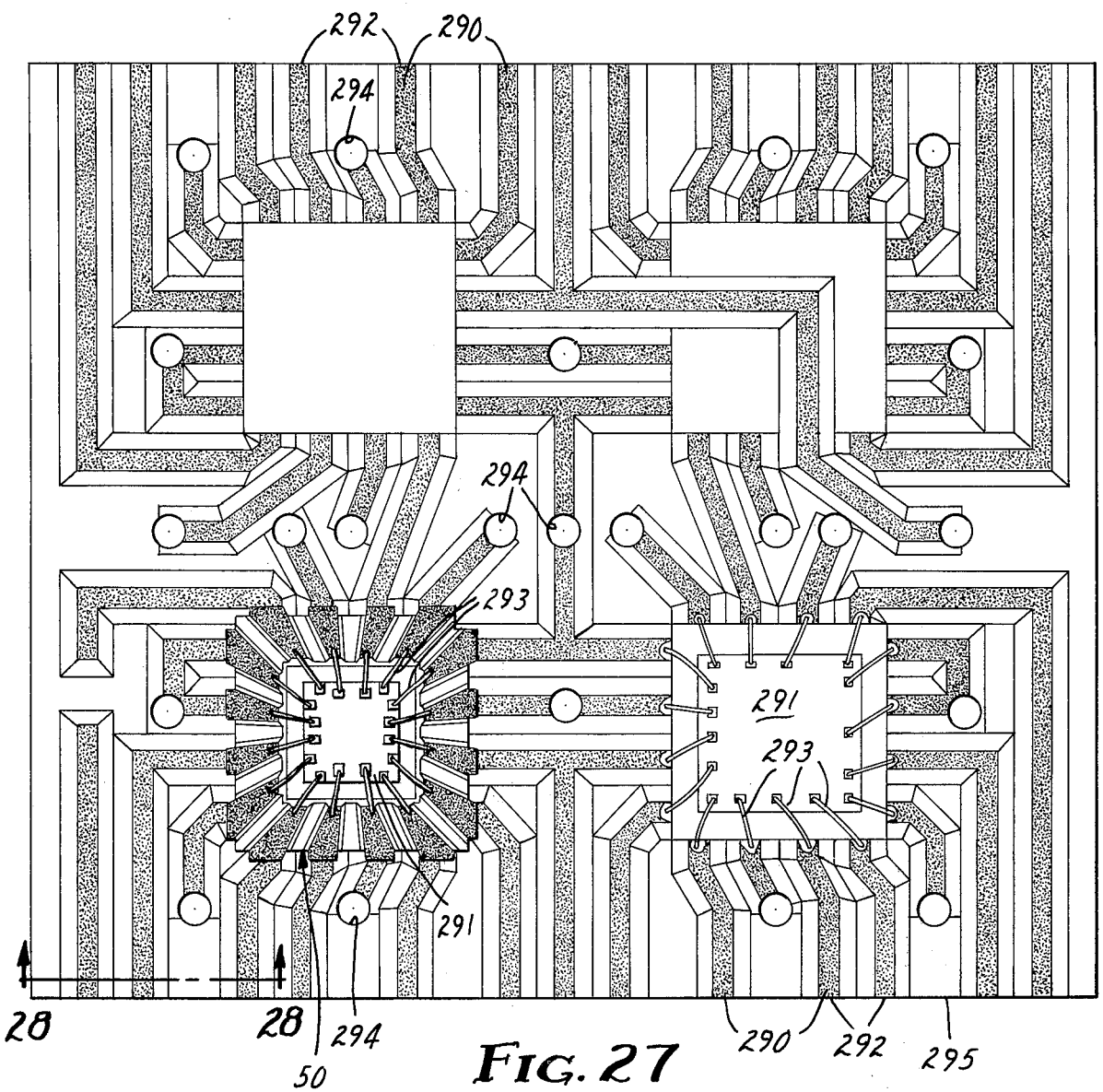
Figure 28:
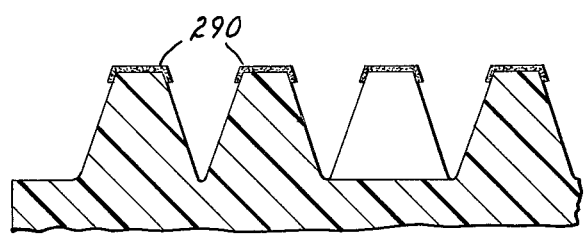

FIG. 27 shows the top surface of a versatile metallized rigid polymeric or plastic substrate of this invention and FIG. 28 shows a partial side view of a portion of the substrate of FIG. 27.

Figure 29:
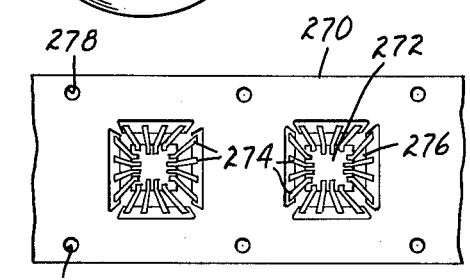
Figure 30:
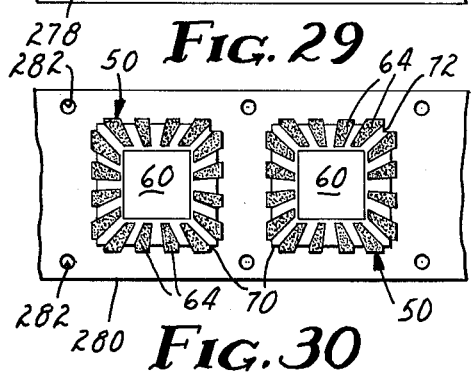
Figure 31:
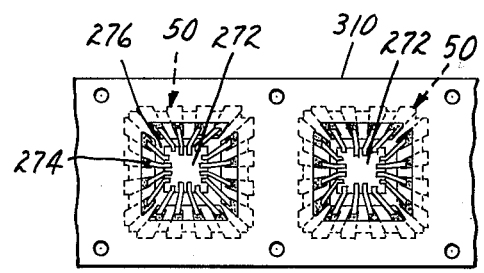
Figure 32:
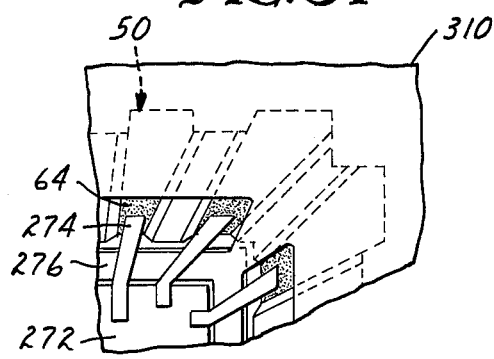

FIGS. 29 through 33 show how chip carriers of the invention can be employed in one type of automated processing. FIG. 29 shows an integrated circuit die mounted on a tape carrier with beam leads. FIG. 30 shows ceramic chip carriers, as shown in greater detail in FIG. 3 mounted on a transport tape. FIG. 31 shows the dice of FIG. 29 mounted in the carriers of FIG. 30 and FIG. 32 is a much enlarged drawing of a portion of one of the chip carriers with attached die as shown in FIG. 31.

Figure 33:
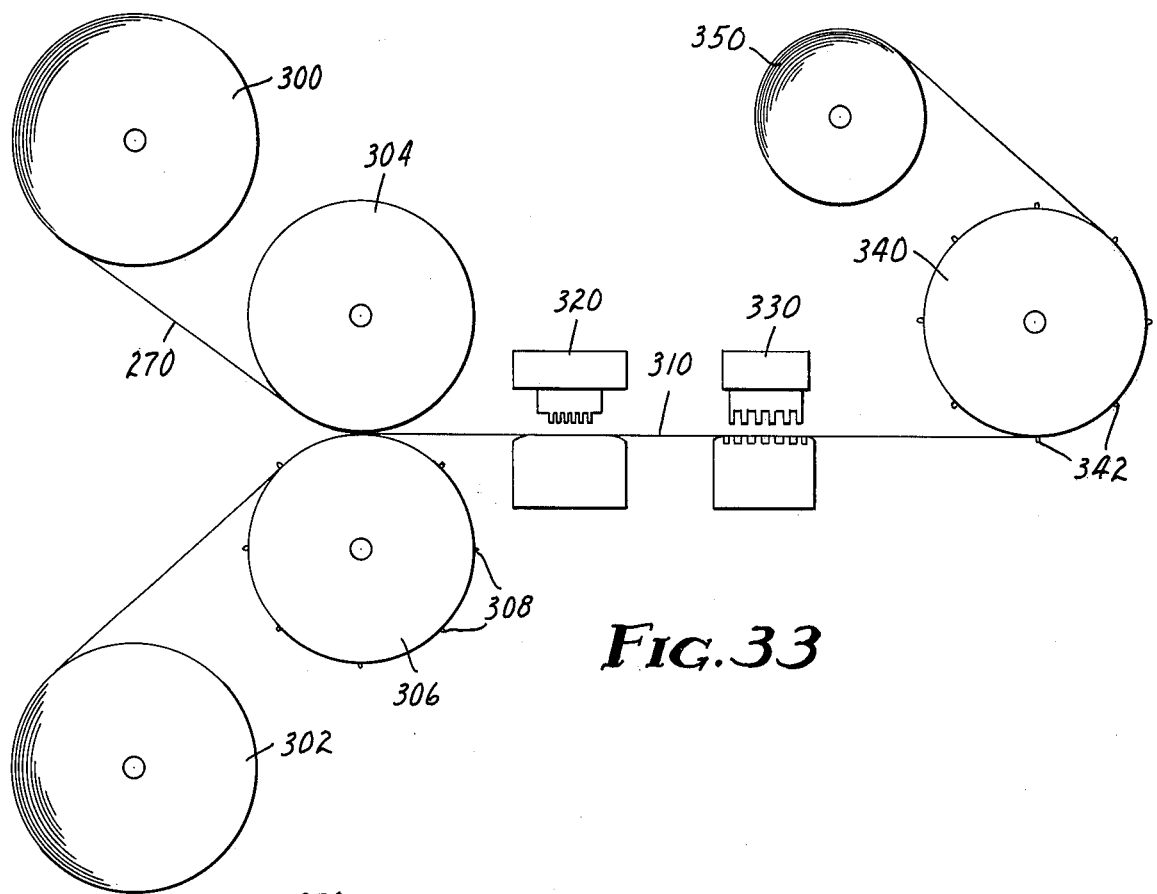

FIG. 33 shows diagrammatically the method of joining tapes of FIGS. 29 and 30 to give the tape of FIG. 31.

Figure 34:
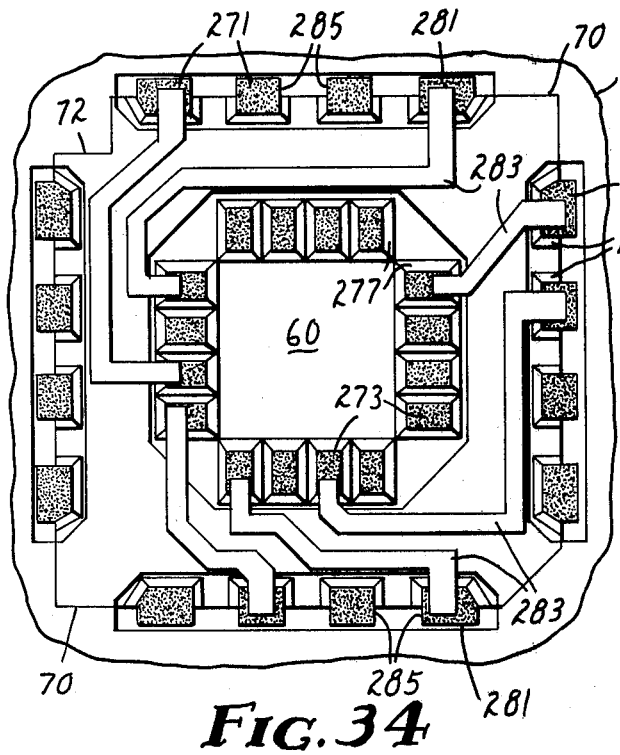
Figure 35:
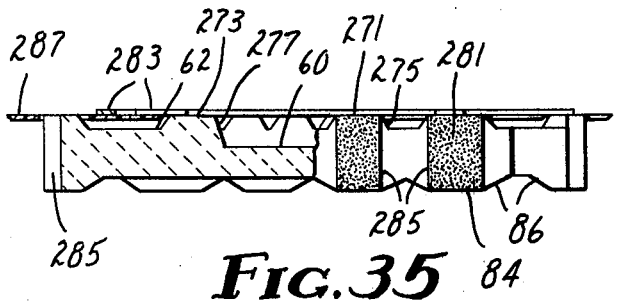

FIGS. 34 and 35 show top and sectional views of a chip carrier of the invention adapted for application of cross-over leads by tape carriers with beam leads.

Figure 36:
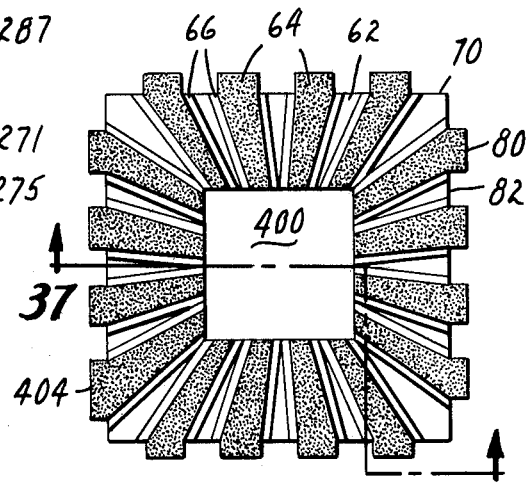
Figure 38:
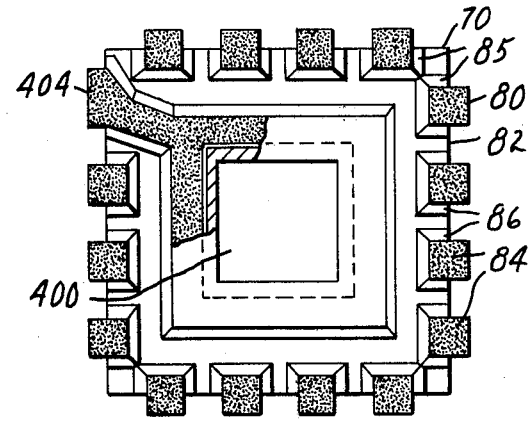
Figure 37:
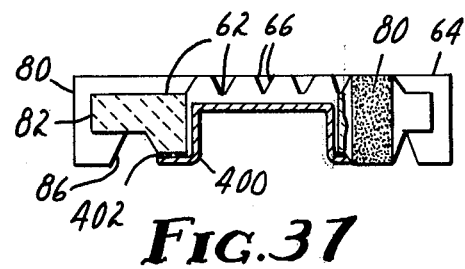

FIGS. 36, 37, and 38 show an embodiment of the invention into which a metallic die attach pad is inserted to give superior heat transfer.

Figures 1, 2:
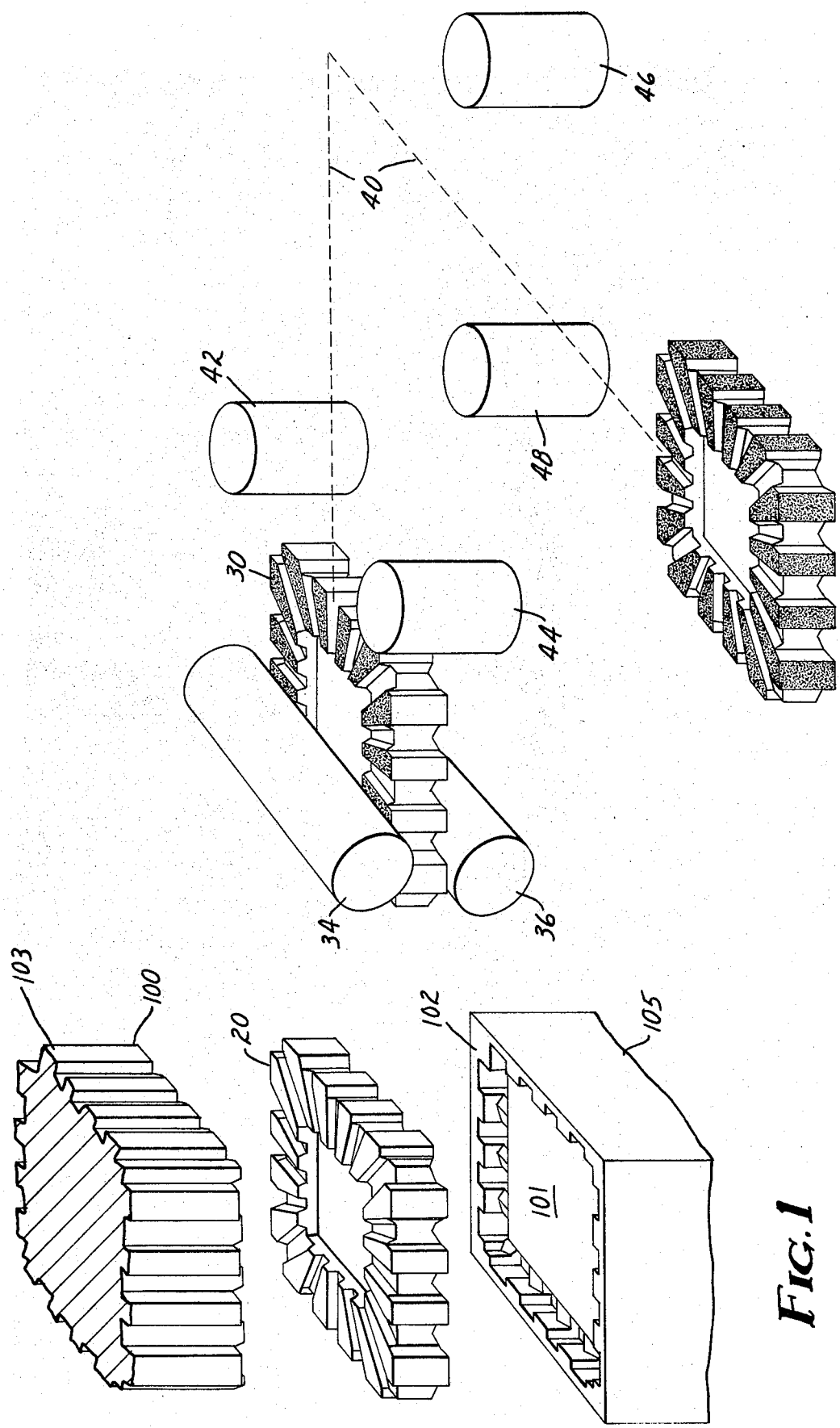
FIG. 1 shows diagrammatically in exploded view the pressing of a green ceramic chip carrier of the invention.
FIG. 2 shows diagrammatically the steps of one procedure for metallizing a fired or green ceramic chip carrier of the invention.

Referring particularly to FIG. 1 it will be seen that upper punch (100) lower punch (101) and die block (102), broken away from their bases at (103) and (105) respectively, form green ceramic chip carrier (20). The structure of green ceramic chip carrier (20), which is illustrative of articles of the invention prepared by the process of the invention, is described in more detail hereinbelow. It will be recognized that these parts are shown much enlarged.

The green ceramic article, such as chip carrier (20), may be fully or partially fired or, if sufficiently compacted, can be used in the green form for the steps shown diagrammatically in FIG. 2 and in other Figures. The step of firing is not shown.

In FIG. 2 the green, or partially or fully fired, ceramic chip carrier (30) is coated with metallizing on upper and lower surfaces by metallizing ink by suitable means here shown diagrammatically as transfer rolls (34) and (36). Means for applying ink to transfer rolls (34) and (36) are not shown but may be in the form of hoppers, sprays, pads, troughs, doctor blades, etc. as is convenient. Likewise other means of applying conductive coatings may be employed as, for example, use of a metallizing transfer tape.

Broken line (40) shows movement of ceramic chip carrier (30) between transfer rolls (42) and (44) and (46) and (48) to which ink is applied as is convenient and which provide metallizing on the embossed sides of ceramic chip carrier (30). It will be recognized that the sequence of metallizing operations is not critical and that different metallizing compositions may be used on different surfaces and/or edges. It may be desirable, as an example, to apply refractory metals such as palladium-silver to the edges and bottom followed by firing and then applying gold metallizing to the upper surface followed by a further firing operation under suitable conditions. Any conventional metallizing materials may be used as desired as will be understood by those of skill in the art.

FIGS. 3, 4 and 5 show a chip carrier of the invention (50) very much enlarged (about 15–30 times) in top or obverse (52) partial sectional, and bottom or reverse (54) views respectively. The section of FIG. 4 is taken along line 4—4 of FIG. 3. It will be seen that on the top or obverse side there is a central depressed area or cavity with die attach pad (60) for reception of a chip (not shown), a base level (62) and embossed metallized surfaces (64). The sides (66) of the embossed surfaces extend downward to the base level at an angle as more fully described below.

The angles are selected as a result of considerations of mechanical requirements in rapid and accurate fabrications of ceramic pieces as is necessary for pieces which are contemplated to be needed in many millions.

Referring again to the circuit chip carrier of FIGS. 3, 4 and 5, which has embossed detail on both major surfaces, the surface with chip cavity and embossed ribs generally radiating outwardly therefrom, shown in FIG. 3, is designated the top surface because it is formed by the upper punch of the compacting die as shown in FIG. 1. Because the upper surface of the part has more detail, it may have a greater tendency to hold the part to the surface of the punch. For this reason, the upper punch (100) is removed from contact with the pressed part and from the die cavity while the pressed part is still held by the sides of the die block (102), and still in contact with the bottom punch (101).

After removal of the upper punch (100) relative motion between bottom punch (101) and die block (102) ejects the pressed part from the die block.

The compressed ceramic part which is still in contact with the bottom punch in certain types of presses must move upward and away from the surface of the bottom punch as it moves laterally in accordance with the angle of the inclined surfaces of the lower punch and of the piece, viz. (86) in FIG. 5. For this purpose, a relatively low angle is preferred for sides of bas-relief parts corresponding to the lower punch (101), e.g. the embossed parts of FIG. 5 so that the ceramic piece does not have to rise so rapidly for a given rate of lateral movement as would be the case with higher angles. Angles within the range of 20° to 45° to the base plane of the lower punch are preferred e.g., for surfaces 86 in FIG. 5. Angles greater than 45° require the part to move upward faster than it moves laterally. This may overstress the part. On the other hand, angles below 20° require more space between conductors e.g., (84 in FIG. 5) and do not permit as small a size for the conductors or the ceramic piece as may be desired. Angles in the range of 30° to 35° have been used, and found to be useful.

It is convenient to make all inclined surfaces so that they present the same angle with respect to the direction of movement of the piece, e.g., two units of upward travel for three units of lateral travel when the angles of the inclined surface to base plane is 33.7° as for (86) in FIG. 5. Therefore the sloping surfaces which are at a 45° angle to the direction of movement of the ceramic piece (inclined surfaces (85) at (70) and (72) in FIG. 5) should form an angle with the base plane of 43.3°.

The angle on the top surface of the part from the base plane to the top of the bas-relief, e.g., of (66) in FIG. 3, is less critical than was the case with the bottom surface of the part. The major requirement is that the bas-relief configuration must release from the top punch and not crack or be torn away from the rest of the compacted ceramic part. This is a function of the physical strength of the compacted ceramic part, the finish of the punch face, the coefficient of friction between the compacted part and the punch and any adhesion of the compacted ceramic to the die surface. The cross-sectional area (in the plane of the upper surface) of the ceramic at the base of the bas-relief configuration becomes larger as the angle of the sloping sides from the base plane of the punch becomes smaller. This limits the minimum distance between adjacent bas-relief structures and conductor spacing increases as the angle of the sides becomes smaller. Angles of 70°-80° are very satisfactory with well-polished punches where the bas-relief ribs are narrow (0.2 mm) and conductor spacing is relatively close (0.6 mm).

Returning again to the Figures, it will be seen that in the embodiment of FIGS. 3, 4 and 5 one corner (72) is made different from the others (70) to provide indexing means for orientation of the carrier before or after a chip is positioned thereon. In addition embossed connector surfaces (80) separated by notches (82) are provided around the edges for connection from the embossed surfaces (64) of the upper surface to embossed surfaces (84) on the lower or reverse surface (54). The several embossed surfaces on both top and bottom and edges are preferably dimensioned so that there can be no interlocking of one carrier with another. For this reason the embossment on the lower surface has edges parallel to the edges of the chip carrier whereas those on the upper surface have edges which are approximately radial from the center of the carrier so that the embossment around the edge varies in width with the position along the edge. The angles between the bottom surface and the edges (86) of the embossment or elevated terminals is determined as set forth above.

A suitable lid for sealing a carrier of FIGS. 3, 4 and 5 may be castellated or denticulated as shown in FIGS. 15 and 16 or a simple lid with no mating castellations may be used as has been used conventionally with chip carriers having no embossed circuitry. Such lids, sometimes referred to as "bathtub lids," are hermetically sealed in place by use of sufficient fusible glass which readily flows into the grooves between embossments.

Figure 3B:
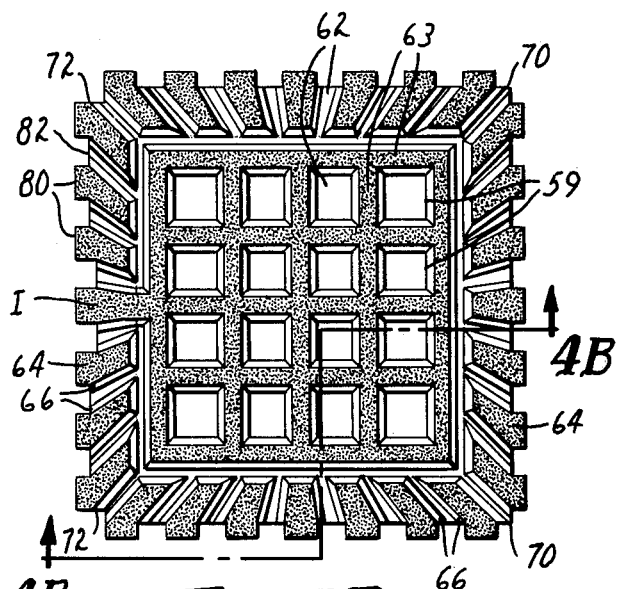
Figure 3C:
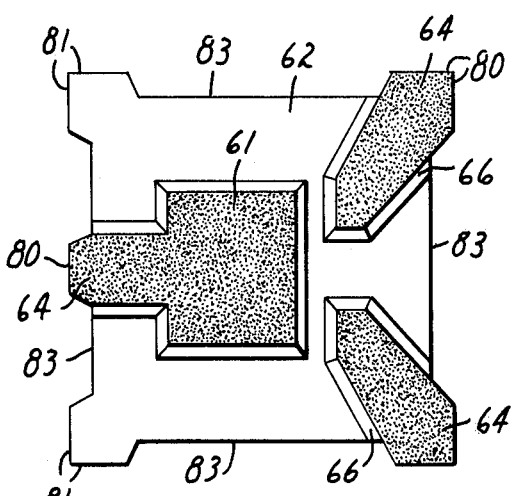
Figure 4B:
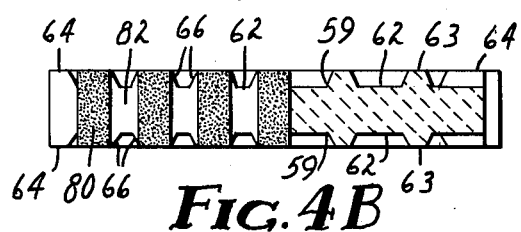
Figure 4C:
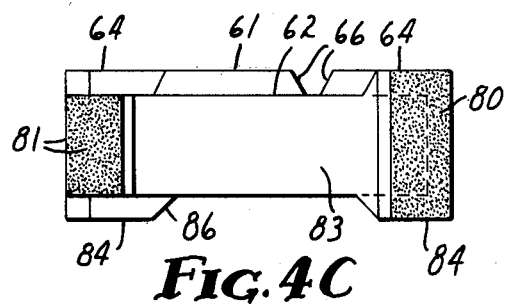
Figure 3A:
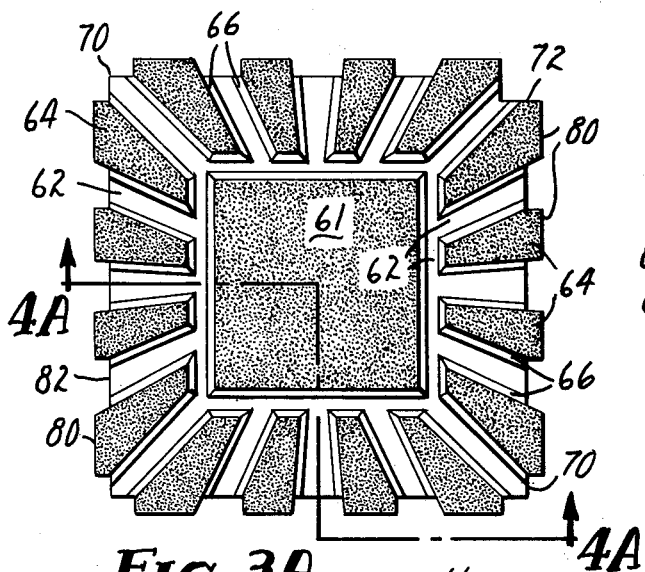
Figure 4A:
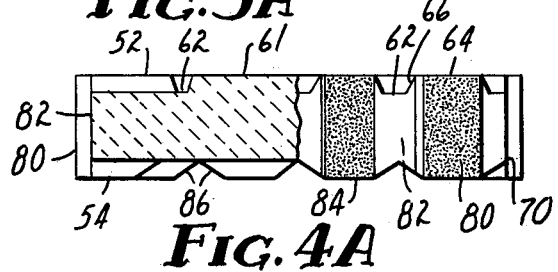
Figure 3D:
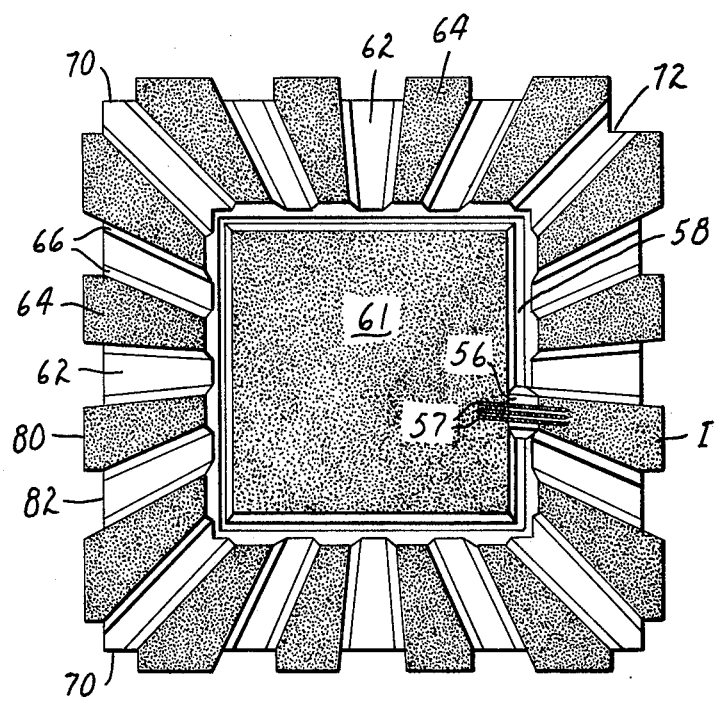
Figure 4D:
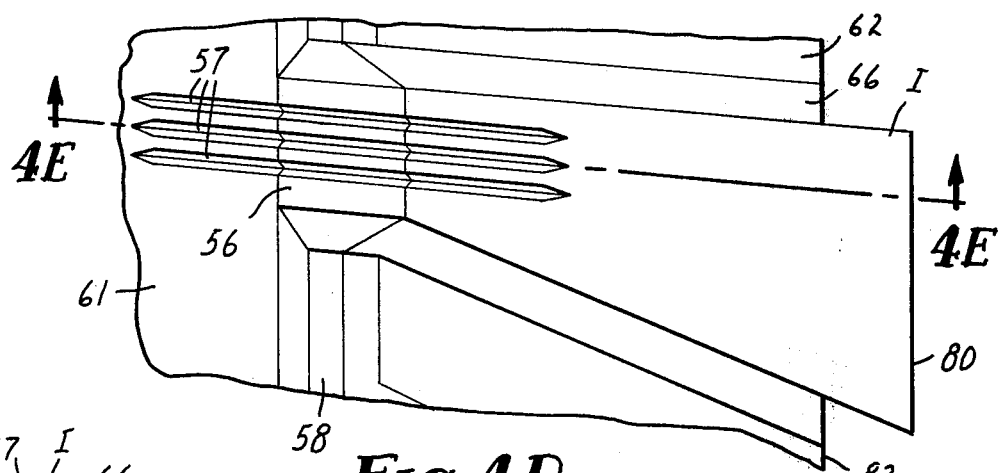
Figure 4F:
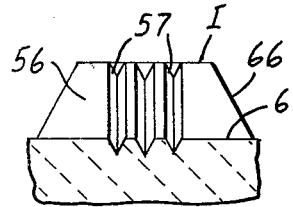
Figure 4E:
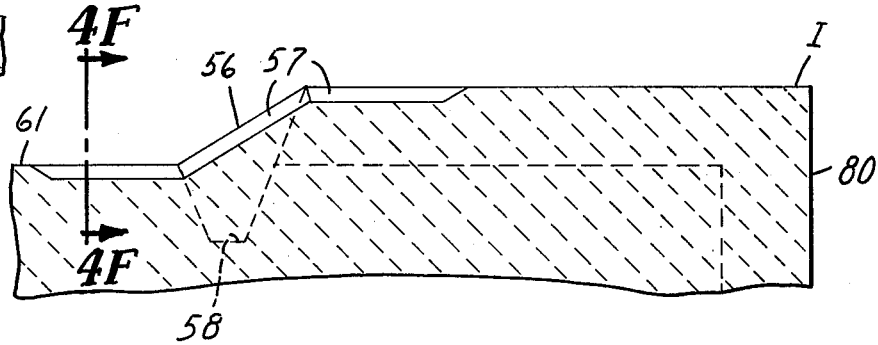

FIGS. 3A, 3B, 3C, and 3D and the sections in FIGS. 4A, 4B, and 4C show embodiments of the invention in which various provisions are made for reception of a chip in the central area. FIGS. 4D, 4E and 4F show enlarged detail of FIG. 3D. Insofar as possible numbering in these figures is the same as in FIGS. 3, 4, and 5, thus top views (52) are provided in FIGS. 3A, 3B, and 3D showing embossed metallized surfaces (64) surrounding an area for a die attach pad, i.e., for reception of a chip, which takes a different form in each figure, but with sides (66) of embossed surfaces as in FIG. 3 extending downward to base level (62).

In the embodiment of FIGS. 3A and 4A a plane embossed chip platform (61) is at the same level as metallized surfaces (64) and is metallized simultaneously therewith. One corner (72) is shaped as an index to distinguish it from the other corners (70). The die attach pad platform (61) is isolated from embossed metallized surfaces by base level (62) extending therearound. The edges and reverse side of the embodiment of FIGS. 3A and 4A are as for FIGS. 3 and 4 except as described above.

The embodiment of FIGS. 3B and 4B has both major surfaces with the same configuration, that is with metallized surfaces (64) with sides (66) and base level (62) as well as an embossed die attach pad grid (63) on each surface. The number one pad (I) is on one side between two indexed (incised) corners (72) and connects directly to the die attach pad grid (63). The other corners (70) are not incised. This indexing makes it possible to locate the specific number one pad (I) whichever side of the corner is uppermost and greatly simplified orientation of carriers in mounting chips thereon. The embossed die attach pad grid (63) effects some saving of metallizing composition and provides the several small cavities (59) as sumps for overflow of adhesive compositions which may be used. It is considered that such a bilaterally receptive mounting chip carrier can increase the rate of mounting chips many times over that possible when only one surface is receptive to mounting a chip, i.e., unilaterally receptive.

FIGS. 3C, 4C, 5C and 5D show a further embodiment of the invention which is particularly useful for devices such as transitors having few leads, in this instance three. The methods of manufacture, including particularly transfer metallization, are very suitable for the production of such articles. Very great savings in time, i.e., greatly increased rates of production, are possible over superficially similar items manufactured as described, for example, by Elliott in U.S. Pat. Nos. 3,271,507 and 3,404,214. Those prior art articles which are intended for inverted mounting require much more manipulation whereas the articles of FIG. 3C, etc. can be produced with automatic processing and at prodigious rates and are intended for mounting upright, i.e., without inversion, using if necessary a suitable cover. It will be seen that the embodiment of FIGS. 3C, 4C, 5C is suitable particularly for mounting devices having five or less terminals, i.e., four corners and a central die attach pad. In the illustrated embodiment three embossed metallized surfaces (64) with sides (66) are provided on base level (62), two at corners and one central of one side which last connects to embossed die attach pad (61). These embossed surfaces form predetermined electrical connections leading to external embossed connector surfaces (80) separated by spaces (83) from one another and from corner embossments (81). The several connector surfaces (80) and surfaces of corner embossments (81) are metallized simultaneously along all four sides because this avoids the problems that would be encountered in attempting to metallize only connector surfaces (80), namely, extra effort at orientation and positioning. The corner embossments (81) are of substantially the same height as the embossments for connector surfaces (80) and thereby promote stability during metallizing operations. The excess metallizing on corner embossments (81) is not functional but represents only inconsequential loss. The underside as shown in FIG. 5C is seen to include three embossed metallized surfaces (84) with sides (86) which provide points for soldering or brazing the carrier to a mother board.

The embodiment of FIGS. 3D and 4D, 4E and 4F is similar in most respects to the embodiment of FIGS. 3, 4 and 5 and identical with respect to the underside as shown in FIG. 5. The difference is that a metallized die attach pad (61) is provided surrounded by a channel (58) except where pad (61) connects by incline (56) to metallized surface (64) designated as number one position (I). Small incisions (57) are provided from pad (61) along incline (56) and to pad (I) so that capillarity provides electrical connection between die attach pad (61) at a lower level and pad (I) at a higher level without the necessity of applying metallization to incline (56) in a separate operation. The structure of incline (56) and incisions or grooves (57) is shown in enlargement in FIGS. 4D, 4E and 4F. It will be seen that cross-section of the incisions is V-shaped because this provides most effective capillarity. The included angle is preferably between about 15° and about 60°.

Referring to FIGS. 6, 7, 8, 9 and 10 the features of dual-in-line chip carriers (73) and (75) respectively are generally the same as in the embodiment of FIGS. 3, 4 and 5 and are indicated by the same index numbers. These embodiments differ, however, in some features which may be preferred in certain applications. Thus, neither carrier is embossed on the underside and instead they have two levels on the top surface (62) and (67) connected by an incline (65) so that these are inverted chip carriers which are bonded to a mother board or printed circuit using the upper terminals (64). A chip (not shown) bonded at (60) is connected to the embossed pattern at its lower level (69) and encapsulated for protection. Indexing of these devices which are free from terminals at the ends is by a notch (88) or other such marking at one end thus permitting orientation. It will be evident that the substrate or chip carrier of FIG. 6 is devoid of embossed connections along the edges or sides whereas the embodiment of FIG. 9 has such bas-relief conductors (80) utilized as described below in the discussion of FIGS. 17 and 18. In either case a simple "bathtub lid" may be employed as described above in connection with FIGS. 3, 4 and 5. Metallizing of pads (60) in FIGS. 6 and 9 may be effected as described above for FIGS. 3D, 4D, 4E, and 4F.

Chip carriers of the invention as shown in FIGS. 3-10 inclusive and 3A, 3B, 3D, 4A, 4B, 4D, 4E, and 4F having multiplicities of more than five terminals are advantageously employed for mounting integrated circuit chips and similar dice. A small amount of suitable adhesive may be used to bond the chip to the base of the chip cavity. If desired, the adhesive could be an electrically-conductive tape, such as conductive epoxy resin and could be extended to make electrical connection to one of the conductors on the chip carrier. Orientation of the circuit is made with reference to corner (72) or notch (88) in these embodiments. Electrical connections are then made from the chip to the conductors on the chip carrier as by wire bonding. It is convenient to test the electronic circuit for integrity at this stage. Similar methods of mounting dice are suitable for carriers as illustrated in FIGS. 3C, 4C, 5C and 5D for mounting dice such as transitors having five or less leads. The chip and adjacent portions of area of the substrate are now encapsulated to protect the circuitry from moisture and provide a measure of physical protection to the small wires and the chip. The chip carrier with tested protected circuit is now ready for mounting, to a circuit board which has conductors on its surface suitably placed to make electrical connection to the pads or terminals (64) or (84) of FIG. 3 of the substrate. Conveniently the conductors of the circuit board and the pads of the chip carrier have been pre-soldered. When heat is applied to melt the solder, the solder masses of the chip carrier and the circuit board unify and when cooled solidify to provide electrical connection and a strong physical bond. Conductive epoxy resins can also be employed. At this point another important feature of the invention is apparent. The spaces (62) and (82) between conductor pads provide spaces for excess solder or epoxy resin so that it is not forced to flow laterally as it might if the two surfaces were flat and brought into close face-to-face engagement. Electrical shorts between conductors can occur when the solder or epoxy resin of adjacent pads is caused to flow laterally. This problem is essentially eliminated by the articles of this invention.

After soldering the chip carrier to the circuit board, it is desirable to flush the entire region with a suitable cleaner to remove any traces of soil or flux residues which are known to have harmful effects and can cause circuit failure. At this point yet another major advantage of the invention becomes apparent. The embossed conductor pads (64) or (84), being above the general plane of the surface (67) or (54), respectively raise the chip carrier substrate sufficiently so that there is ample space for cleaning liquid to flow easily between the chip carrier and the circuit board dissolving and flushing away all exposed flux residues.

FIGS. 11 through 14 show processes for metallizing articles of the invention in more detail than the diagrammatic process of FIG. 2 but are still diagrammatic. It will be understood that these processes are essentially illustrative and that other procedures may also be used and that proportions are not intended as indicative of actual full scale operations. FIG. 12 shows particularly a process for metallizing one surface of a ceramic article of the invention, FIGS. 11 and 14 show processes for metallizing edges of articles of the invention and FIG. 13 shows a process for metallizing dual-in-line articles of the invention as illustrated in FIGS. 6-10.

Referring to FIGS. 11 and 14 it will be seen that ceramic articles or chip carriers (110) are edge metallized. In FIG. 11 the articles are on edge and in FIG. 14 resting on their backs. In both Figures the articles travel in a conveyor belt (112) and are guided by guides (114). The metallizing employed is conveniently a transfer tape which is a composite of a flexible backing and transferable metallizing composition as a layer on the backing. In FIGS. 11 and 14 the supply rolls (116) of transfer tape (122) are not shown in proportion to the sizes of the chip carriers (110) and will actually normally contain very large amounts of transferable composition. The metallizing is transferred from rolls (118) to the edges (124) of chip carriers (110) to provide metallizing (126) as is evident particularly in FIG. 14. At the same time portions of the transfer tape are removed, as is also shown in FIG. 14, and the used transfer tape is wound on takeup roll (120). The chip carriers (110) may be redirected to travel at 90° to the first direction so that the other opposite edges may be metallized with a second-stage application.

FIG. 12 shows a process for metallizing the major surfaces of the chip carriers of FIGS. 3, 4 and 5 by transfer of wet metallizing material. A vibratory feeder (131) delivers chip carriers or other parts (130) onto a slide (133) with a major surface of the chip carrier in contact with the slide surface. Stop (135) prevents parts not having a major surface in contact with slide (133) from feeding into the process. Conveyor (137) which travels around roller guides (139) and over backup plate (136) moves chip carriers (130) into the path of transport film (140) unrolling from supply roll (142). Transport film (140) has a agressive pressure sensitive adhesive layer to which chip carriers (130) adhere as a result of force applied by pressure roller (144). Transport film (140), carrying the adhesively held chip carriers (130) moves around large idler roller (146) and onto the upper surface a support plate (148) under pressing shoe (150) which, by action of eccentric wheel (152), presses against the top surface of all parts to make certain that the top surfaces of all chip carriers (130) are in the same plane within about 0.01 mm. The chip carriers (130) are then moved by transport film (140) under metallizing roller (154). Container (156) with integral knife coating blade provides the desired thickness of metallizing material on metallizing roller (154). The height of roller (154) above chip carriers (130) is set so that all parts of the raised bas-relief surfaces come into contact with the metallizing material to a depth, for example, of 0.02 to 0.07 mm.

Transport film (140) is then stripped from the parts and rewound on take-up roll (158) while the chip carriers are transferred to conveyor (160) and through kiln (162) to sinter the metallizing material onto the top surface. A second pressure sensitive transport film (170) from supply roll (172) passing around pressure wheel (178) and assisted by pressure shoe (176) and support plate (174) may be employed to pick up the chip carriers for metallizing the other sides.

If metallization on one side is to be different from the other, the orientation of individual chip carriers or other parts may be determined after feeder (131) and means provided orient the parts as desired. A multiplicity of feeders may be used if needed to deliver parts at a very high rate. The capacity of such a process is evident from the following figures. A carrier 10 cm wide traveling at 2.5 cm per second will deliver about 100,000 chip carriers having an area of about 0.3 cm$^2$ per hour if one third of the area is occupied by parts. It is assumed that ⅓ of the area is occupied by parts because, in general, parts are desirably separated from one another so that the wet metallizing will not bridge the gap between adjacent parts, but will be allowed to go over all edges where metallizing is desired.

Although patternwise silk screening of parts is relatively slow because of the necessity for registration, etc. the use of rotary screens as the metallizing roller (154) is very efficient.

FIG. 13 illustrates a process by which the leadless inverted device substrates of FIGS. 6–8 may be metallized. A vibratory bowl feeder (180) is used to feed chip carriers (182) and align them so that the length of the parts is aligned with the direction of travel. They are moved forward on a conveyor below the channel shown. Misaligned parts are returned to the feeder bowl. A sensor (184) is placed near the discharge port of the feeder to determine whether the passing chip carrier has the chip cavity on the upper surface of the part. Those with the chip cavity in the upward position are allowed to pass directly to the first channel (18). Those with the chip cavity on the lower surface are pushed laterally by means (188) into second channel (190) with conveyor (not shown). Channel (190) has a 180° twist such that parts delivered out of channel (190) are in the desired upright position. The parts in each channel then pass between guiding means at the discharge end of the channels onto conveyor (192) turning on roller (194). The parts are aligned with the mating contour (200) of the applicator roll (196). Conveyor (192) carries the parts under applicator roll (196) so that the surface speed of the parts is the same as that of the applicator roll. If desired, a vacuum or other means may be provided to hold the parts snugly against conveyor (192) so that the surface tension of wet metallizing material cannot lift the parts on applicator roll (196). A suitable reservoir (202) provides metallizing paste (204) to roll (196) and a contoured doctor blade (not shown) is provided to control the thickness of metallizing paste applied to the mating contours (200) of applicator roll (196). After metal paste has been applied to the bas-relief surfaces of the chip carriers they are moved through a dryer (not shown) and a kiln (not shown) to sinter the metallizing material.

FIGS. 15 and 16 show a package cover (210) for the chip carrier of FIGS. 3, 4 and 5 in plane and partially sectional edge views. It could be made with square corners rather than cut off at 45° angle if desired. It will be seen that cavity (212) in the package cover of FIGS. 15 and 16 provides additional space for a chip (not shown) mounted in cavity (60) of the chip carrier of FIGS. 3, 4 and 5. The denticulations or castellations (214) of cover (210) mate with the spaces between the embossed metallized portions (64) of FIGS. 3 and 4 so that the flat surfaces of denticulations (214) can be sealed against the bottoms (62) of the spaces (recesses) of FIGS. 3 and 4.

FIG. 17 shows a package cover (220) for use with a dual-in-line chip carrier (73) of FIG. 6 or (75) of FIG. 9. It will be seen to include cavity (222), denticulations or castellations (224) and notch (226). The denticulations or castellations may be coated with adhesive of any desirable type such as pressure-sensitive or heat activated to effect temporary bonding to the chip carrier on contact during assembly. Permanent bonding may be effected using glues or other compositions as desired. Preferably any adhesive will not interfere with the advantageous tendency for covers to seat themselves to optimum closure. In FIG. 18, cover (220) is shown in position on a chip carrier (75) of FIG. 9 with leads (228) fitted to and bonded to the edge embossment (80). Leads (228) are, of course, much stiffer than leads of the prior art because of their angled structure and are therefore less subject to being bent and displaced from their nominal position. The package cover (220) of FIG. 16 may conveniently be adhered to the package (75) by use of powdered glass which is sintered and serves to bond the package cover to the substrate.

FIGS. 19, 20 and 21 show a connector (230) having bas-relief conductors (232) on the upper surface connecting to end conductors (234) and bottom terminals (238), separated by notches (236). In FIG. 22 it is seen how the connector (230) is employed in connection with a circuit board (246) to connect between leads (240) and (242) while bridging leads (244). The notches (236) permit of more ready cleaning of solder and flux residues. If desired a cavity (not shown) can be provided in the underside (FIG. 21) of connector (230) so that devices may be bridged over by leads. This permits conservation of space on the surface of the circuit board and facilitates making desired cross-connections. As is true generally for articles of the invention the embossed conductors provide reduction in capacitance between leads. Thus, conductors (244) of FIG. 22 will exhibit high capacitive coupling because they are on a continuous base having a higher dielectric constant then the air between, e.g., conductors (232) of this connector.

FIGS. 23, 24 and 25 show a cross-connector (250) for connection between terminals along different edges including T-conductors (252) among three terminals, straight through conductors (254) and right-angle L-conductors (256). It will be recognized that the cross-connector of FIGS. 23–25 is merely illustrative. It is further contemplated that one or more devices may be included in the cross-connector such as resistors, capacitances or semiconductor devices. The manner in which such a cross-connector is used is shown in FIG. 26 where interconnections are provided between terminals in the top (260) and bottom (262) rows and additionally to certain of the leads (264) passing underneath the cross-connector as well as between top or bottom and sides (266) or combinations. Leads passing under the connector are indicated by broken lines and it will be seen that rather complex interconnections are readily achieved with ease.

FIGS. 27 and 28 show a plastic base plate (295) according to the invention suitable for mounting chips (291) with leads (293) either directly or in a chip carrier, e.g. of the type (50) shown in FIGS. 3 to 5 inclusive. In this base plate bas-relief connectors (290), metallized as shown in FIG. 28, are provided to which chip carriers as shown in FIGS. 3 to 5 or connectors as shown in FIGS. 19-26 are mounted by the terminals on the reverse side. Connections to this base plate are made either at the ends of connectors (292) or by wires attached at holes (294). It will be understood that the plastic base plate (295) of FIGS. 27 and 28 is essentially diagrammatic and the circuitry will be dependent on the chips to be mounted and circuitry required therewith. One connection is shown crossing an area to illustrate the ease with which this is possible without interfering with the chip carrier or connector. In FIG. 28 the notches (296) between connectors (290) are shown with a V-shape as this may be desirable in some circumstances. The plate (295) of FIGS. 27 and 28 is considerably larger than the plates shown in other figures and FIG. 28 therefore shows only a portion of the thickness.

FIGS. 29 through 33 show how carriers of the invention can be used in the automated mounting of devices such as integrated circuit chips. In FIG. 29 is shown a portion of a transfer tape (270), sometimes called a beam-tape, with integrated circuit chips (272) attached at the inner ends of leads (274) where they project over the edge of film support (276). Holes (278) are provided in tape (270) for positioning the tape in the mounting and other operations as will appear.

Transfer tape (280) of FIG. 30 bears chip carriers as shown on larger scale in FIGS. 3, 4 and 5 and with index corners (70) in the same orientation. Details are not further indicated as they are the same as in FIGS. 3, 4 and 5. Holes (282) are provided for positioning the tape. The carriers are attached to the tape in predetermined positions and orientation by any convenient means as by adhesive, insertion in suitable apertures, by built up edge portions, crimping of the tape and other readily apparent means.

Supply rolls are provided of tapes (270) and (280) as shown at (300) and (302) respectively in FIG. 33 and the tapes pass over synchronized rollers (304) and (306) with pins (308) on roller (306) for bringing the leads (274) of tape (270) in correct position with the terminals (64) of the chip carrier. Pins (308) engage sockets (not shown) in roll (304). The tapes (270) and (280) may be adhered at this point if desired to assure proper alignment. The combined tapes (310) are seen in FIG. 31 after passing station (320) at which outer ends of leads (274) are attached to terminals (64). In the process shown diagrammatically in FIG. 33 combined tapes (310) pass station (330) which provides for electrical testing. Further stations, e.g. for removing rejects, attaching suitable covers and the like steps, can be inserted in the sequence before tape (310) passes over roller (340) with pins (342) and is wound on stock roll (350). Rolls such as (350) constitute an elongated web bearing package units at predetermined loci and having indicia for positioning the loci at selected stations in an apparatus for locating said package units for further operation thereon.

FIGS. 34 and 35 show a chip carrier of the invention in which cross-over leads are imposed by use of beam lead tapes. The underside has simple corresponding outer terminals without the imposed leads. The embossments together define a predetermined electrical pattern inasmuch as the external leads connect between upper and lower positions and inner and outer terminals receive imposed beam leads as electrical connections. Because cross-over of leads is possible this embodiment is adaptable to situations which may otherwise require extensive revisions of patterns of electrical leads in mother boards or integrated circuits. It will be seen that a central area (60) is provided for attachment of a die or integrated circuit. Around the central area and embossed above base level (62) are inner metallized terminals (273) with inclined sides (277) and around the periphery of the carrier with corners (70) and one indexed corner (72) are outer metallized terminals (271) with inclined sides (275). Outer metallized terminals (271) are connected to inner terminals by metallic connectors (283) which may be in one or more planes separated by insulating layers of carrier film (287). The number of planes is determined by the complexity of the cross-overs necessary. Only one of the planes is illustrated to avoid confusion. Such connectors are readily applied by methods described above in connection with FIGS. 29 to 33. Outer metallized terminals (271) are connected by external leads (281) to metallized surfaces (84). The sides (285) of the outer leads and (86) of the lower metallized surfaces are, of course, not metallized as is true elsewhere herein with respect to sides of embossments where not specifically indicated otherwise.

FIGS. 36, 37, and 38 show a further embodiment of the invention in which an aperture or opening is provided in the center for reception of a thin sheet metallic die attach pad (400) which is secured by brazing or soldering to metallized rim (402) on the lower surface. Electrical connection to the metallic die attach pad is to one outer terminal (404) as seen in FIG. 38 which terminal is indexed by being somewhat wider than other terminals which have embossed metallized surfaces (64) and sides (66) on base level (62). As in FIGS. 3, 4, and 5, outer metallized embossed connector surfaces (80) separated by notches (82) connect to embossed metallized and embossed surfaces (84) on the lower or reverse surface. The metallic die attach pad provides superior heat conductivity from a die attached thereto and the brazing of it in place assures hermeticity and electrical connection.

What is claimed is:

1. As an article of manufacture a monolithic body with two major surfaces having on at least one of said major surfaces and integral therewith and on at least one other surface or edge and integral therewith embossments in bas-relief with sides and with planar outer surfaces, said embossments having a height in the range of 10 to 35% of the thickness of the body, only the planar outer surfaces of all said embossments being covered with electrically conductive coatings, all other surfaces of said monolithic body being uncovered with electrically conductive coating, said coated planar outer surfaces of said embossments together constituting a predetermined pattern for electrical interconnections.

2. An article according to claim 1 wherein the body is composed of ceramic.

3. A ceramic article according to claim 2 wherein the embossments on said one major surface are in two levels connected by an incline.

4. A ceramic article according to claim 2 additionally having at least one position for reception of a semiconductor die.

5. A ceramic article according to claim 1 having embossments on both major surfaces and at least one edge.

6. A ceramic article according to claim 5 having embossments around four edges and further having at least one position for reception of an integrated circuit die.

7. A monolithic body according to claim 1 having thereon and integral therewith embossments on two major surfaces and comprising at least one position on one major surface of said monolithic body adapted for reception of a die and for connection thereof to embossments on the same surface.

8. The combination of monolithic body according to claim 7 and semiconductor die with leads bonded thereto mounted on said body and with said leads outwardly bonded to embossments of said body.

9. The combination of monolithic body and lead-bonded semiconductor die according to claim 8 and a preformed cover for said semiconductor die and outer leads thereof adhered to said monolithic body wherein embossments and recesses between embossments peripherally of said outer leads mate with recesses and embossments, respectively, of said preformed cover.

10. The combination of claim 9 wherein said cover is hermetically sealed to said monolithic body enclosing said lead-bonded semiconductor.

11. The combination of claim 10 wherein said monolithic body and cover are comprised of refractory ceramic.

12. A monolithic body according to claim 7 having at least one die attach pad on one major surface parallel to the planar outer surface of embossments on that surface.

13. A monolithic body according to claim 7 having a central aperture adapted to receive a thin sheet metallic die attach pad and further having means for securing said die attach pad to said body and connecting electrically thereto.

14. A monolithic body according to claim 7 having on one major surface at least one position for reception of a die, first embossments for attachment to a die mounted in said position and peripheral thereto, second embossments peripheral of said body and beam electrical connectors in at least one plane connecting said first embossments and said second embossment the outer planar surfaces of said first and second embossments being coplanar.

15. An article according to claim 1 wherein the body is composed of rigid polymeric material.

16. An article according to claim 15 wherein the outer surfaces of the embossments are in more than one plane.

17. An article according to claim 15 having at least one position for reception of a semiconductor die.

18. An article according to claim 15 having embossments on both major surfaces and at least one edge.

19. An article according to claim 18 having embossments on both major surfaces and around four edges and further having a position for reception of at least one integrated circuit die.

* * * * *